United States Patent
Oh

(10) Patent No.: US 7,388,227 B2
(45) Date of Patent: Jun. 17, 2008

(54) METHOD FOR FABRICATING LIQUID CRYSTAL DISPLAY DEVICE USING TWO MASKS

(75) Inventor: Kum-Mi Oh, Gyeonggi-Do (KR)

(73) Assignee: LG Display LCD Co., Ltd., Seoul (KR)

( * ) Notice: Subject to any disclaimer, the term of this patent is extended or adjusted under 35 U.S.C. 154(b) by 0 days.

(21) Appl. No.: 11/002,644

(22) Filed: Dec. 3, 2004

(65) Prior Publication Data

US 2005/0139836 A1   Jun. 30, 2005

(30) Foreign Application Priority Data

Dec. 29, 2003   (KR) ...................... 10-2003-0099325

(51) Int. Cl.
*H01L 21/84* (2006.01)
(52) U.S. Cl. .................. 257/72; 257/59; 257/E27.111; 349/139; 349/192
(58) Field of Classification Search .................. 257/72, 257/59, 60, 61, 70, 21, E29.147, E27.111, 257/343, 43; 349/106, 43, 47, 139, 140, 349/143, 192
See application file for complete search history.

(56) References Cited

U.S. PATENT DOCUMENTS

| | | | |
|---|---|---|---|
| 5,990,999 A * | 11/1999 | Yeo ............................. | 349/139 |
| 6,545,735 B1 * | 4/2003 | Koide et al. ................. | 349/113 |
| 6,927,814 B2 * | 8/2005 | Lee et al. .................... | 349/106 |
| 2005/0140890 A1 * | 6/2005 | Kim et al. ................... | 349/139 |

* cited by examiner

*Primary Examiner*—Thomas Dickey
*Assistant Examiner*—Fazli Erdem
(74) *Attorney, Agent, or Firm*—McKenna, Long & Aldridge LLP

(57) ABSTRACT

A method for fabricating a liquid crystal display device includes: forming a pixel electrode on a substrate; forming a first conductive layer on the pixel electrode; forming a first photoresist pattern on the conductive layer; forming a source electrode forming portion, a channel forming portion and a pixel electrode forming portion using the first photoresist pattern as a mask; forming a semiconductor layer over an entire surface of the substrate; forming an insulating layer on the semiconductor layer; forming a second conductive layer on the insulating layer; forming a second photoresist pattern on the second conductive layer; forming an active layer using the second photoresist pattern; and forming a gate electrode on the active layer.

6 Claims, 8 Drawing Sheets

METHOD FOR FABRICATING LIQUID CRYSTAL DISPLAY DEVICE USING TWO MASKS

The present invention claims the benefit of Korean Patent Application No. 2003-99325 filed in Korea on Dec. 29, 2003, which is hereby incorporated by reference.

BACKGROUND OF THE INVENTION

1. Field of the Invention

The present invention relates to a method for fabricating a liquid crystal display, and more particularly, to a method for fabricating a liquid crystal display (LCD) device using two masks.

2. Description of the Related Art

As interest in image display devices and demand for portable information device increases, a thin film type Flat Panel Display (FPD) devices have been developed and replaced traditional Cathode Ray Tubes (CRT) type display devices. In particular, a liquid crystal display (LCD) device having the characteristic of an optical anisotropy has replaced the CRT. Further, the liquid crystal display device has been used in notebook computers, desktop monitors, or the like because it has an excellent resolution, color rendering capability and picture quality.

A liquid crystal display device includes a color filter substrate, which is a first substrate, an array substrate, which is a second substrate, and a liquid crystal material formed between the two substrates. A thin film transistor, which uses amorphous silicon or polycrystalline silicon as a channel layer, is used as a switching device of the liquid crystal display device. A process for fabricating the liquid crystal display device usually requires a plurality of photo-mask processes in fabricating the array substrate including the thin film transistor.

FIG. 1 is a plan view showing a unit pixel of an array substrate of a liquid crystal display device of the related art. In a typical liquid crystal display device, the 'N' number of gate lines and the 'M' number of data lines cross each other, forming the 'N x M' number of pixels. For the purpose of simplicity, only one pixel is presented in the FIG. 1. As shown in FIG. 1, the array substrate 10 includes: a pixel electrode 18 formed at a pixel region; gate lines 16 and data lines 17 disposed vertically and horizontally on the substrate 10; and a thin film transistor used as a switching device, which is formed at a region adjacent to where the gates lines 16 and the data lines 17 cross each other.

The thin film transistor includes: a gate electrode 21 connected to the gate line 16; a source electrode 22 connected to the data line 17; and a drain electrode 23 connected to the pixel electrode 18. Also, the thin film transistor includes: a first insulating layer (not shown) and a second insulating layer (not shown) for insulating the gate electrode 21 and source/drain electrodes 22 and 23; and an active layer 24 for forming a conductive channel between the source electrode 22 and the drain electrode 23 by a gate voltage supplied to the gate electrode 21. The source electrode 22 is electrically connected to a source region of the active layer 24 and the drain electrode 23 is electrically connected to a drain region of the active layer 24 through first contact holes 40a formed in the first and second insulating layers. Since a third insulating layer (not shown) has a second contact hole 40b exposing the drain electrode 23, the drain electrode 23 and the pixel electrode 18 are electrically connected to each other through the second contact hole 40b.

FIGS. 2A to 2G are cross-sectional views along the line I-I of the liquid crystal display device shown in FIG. 1 showing fabrication processes according to the related art. As shown in FIG. 2A, the active layer 24 of polysilcon is formed on a transparent substrate 10, such as a glass, by using a photolithography process.

Next, as shown in FIG. 2B, a first insulating layer 15a is deposited over the entire surface of the substrate 10 on which the active layer 24 is formed and a conductive metal layer 30 are deposited on the first insulating layer 15a.

Next, as shown in FIG. 2C, a gate electrode 21 is formed on the active layer 24 with the first insulating layer 15a interposed therebetween by patterning the conductive metal layer 30 using a photolithography process. Thereafter, source/drain regions 24S and 24D are formed by injecting N+ or P+ high density impurity ions into side regions of the active layer 24 using the gate electrode 21 as a mask. The source/drain regions 24S and 24D are formed for ohmic contacts of the active layer to the source/drain electrodes.

Next, as shown in FIG. 2D, after a second insulating layer 15b as an interlayer is deposited over the entire surface of the substrate 10 on which the gate electrode 21 is formed, the first contact holes 40a exposing the source/drain regions 24S and 24D are formed through the first insulating layer 15a and the second insulating layer 15b through photolithography.

Thereafter, as shown in FIG. 2E, after a conductive metal is deposited over the entire surface of the substrate 10, the source electrode 22 connected to the source region 24a and the drain electrode 23 connected to the drain region 24b are formed through the first contact holes 40a. At this time, a part of the conductive metal constructing the source electrode 22 is extended to be connected to the data line 17.

Next, as shown in FIG. 2F, a third insulating layer 15c, an organic insulating layer, such as Acryl, is deposited over the entire surface of the substrate 10, and the second contact hole 40b is formed to expose the drain electrode 23 by photolithography.

Finally, as shown in FIG. 2G, transparent conductive materials, such as Indium Tin Oxide (ITO), are deposited over the entire surface of the substrate 10 and into the second contact hole 40b. The pixel electrode 18 is connected to the drain electrode 23 through the second contact hole 40b and patterned by using photolithography on the transparent conductive materials. More specifically, the photolithography forms an active pattern, a gate electrode, a first contact hole, source/drain electrodes, a second contact hole and a pixel electrode, respectively, when fabricating a liquid crystal display device including a polysilicon thin film transistor.

Photolithography refers to a series of processes in which desired patterns are formed by transcribing a pattern drawn on a mask to a substrate on which a thin film is deposited, and includes a plurality of processes, such as photoresist solution application, exposure, development, or the like. As a result, a plurality of photolithography processes lower production yield and are prone to cause defects in the thin film transistor. Since a mask used for photolithography is very expensive, if many number of masks are used to form LCD device, ion costs for the liquid crystal display device are also increased. Thus, productivity can be increased, if the usual number of photo-mask steps is decreased.

SUMMARY OF THE INVENTION

Accordingly, the present invention is directed to a method for fabricating a liquid crystal display (LCD) device using a reduced number of masks that substantially obviates one or more of the problems due to limitations and disadvantages of the related art.

An object of the present invention is to use two masks to fabricate a liquid crystal display device which uses a polysilicon thin film transistor.

Another object of the present invention is to reduce fabrication costs and improve yield reducing the number of masks used in the fabrication processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a method for fabricating a liquid crystal display device including: forming a pixel electrode on a substrate; forming a first conductive layer on the pixel electrode; forming a first photoresist pattern on the conductive layer; forming a source electrode forming portion, a channel forming portion and a pixel electrode forming portion using the first photoresist pattern as a mask; forming a semiconductor layer over an entire surface of the substrate; forming an insulating layer on the semiconductor layer; forming a second conductive layer on the insulating layer; forming a second photoresist pattern on the second conductive layer; forming an active layer using the second photoresist pattern; and forming a gate electrode on the active layer.

In another aspect, a liquid crystal display device includes: a pixel electrode formed on a substrate; an active layer overlapping and connecting with the pixel; a gate electrode formed over the active layer; and a source electrode formed on the substrate such that the active layer overlaps the source electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Cost for fabricating a liquid crystal display device can be reduced if the number of masks used to fabricate a thin film transistor is reduced. Each of the masks used for photo-mask processes is expensive. Further, photolithography involves a plurality of sub-processes, such as alignment of a mask on a substrate, exposure, development, photoresist stripping, cleaning and so on. Therefore, if the number of masking processes for forming a thin film transistor is reduced, many sub-processes can be eliminated. Accordingly, efforts to reduce the number of masking processes used to fabricate a thin film transistor has been continually studied by the inventor of the present application. As result of this study, a method for fabricating a thin film transistor using two masks has been developed.

Figure 1:
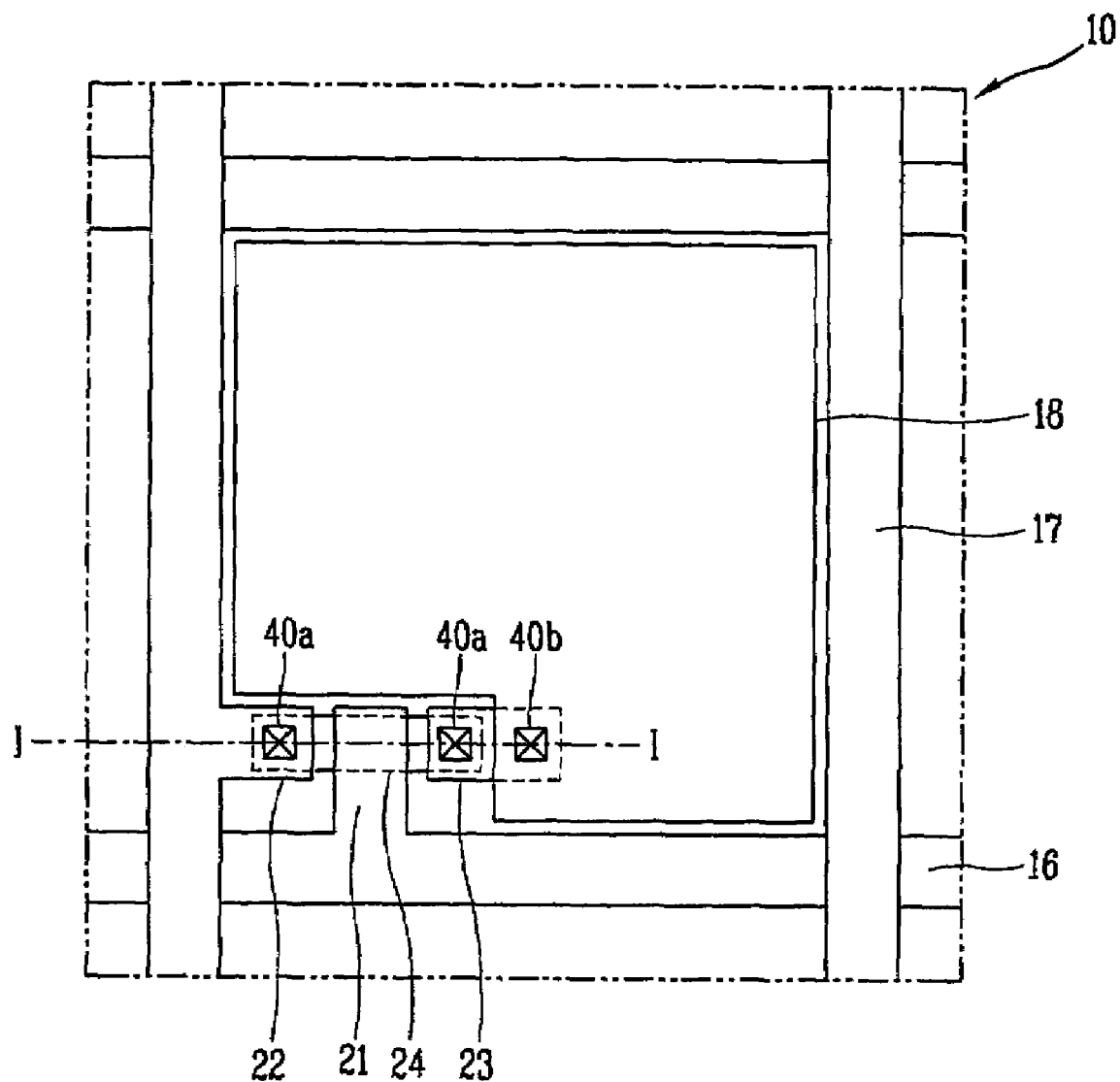
FIG. 1 a plan view showing a part of an array substrate of the related art liquid crystal display device.
Figure 2A:
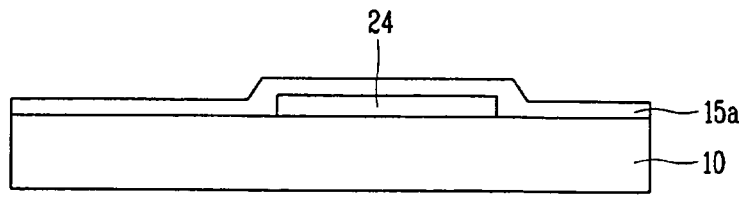
FIGS. 2A to 2G are cross-sectional views along the line I-I of the liquid crystal display device shown in FIG. 1 showing fabrication processes according to the related art.
Figure 2B:
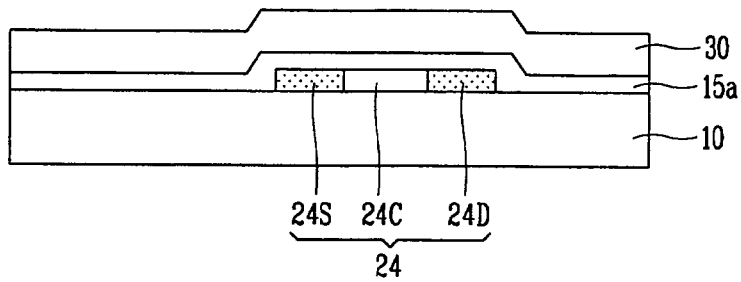
Figure 2C:
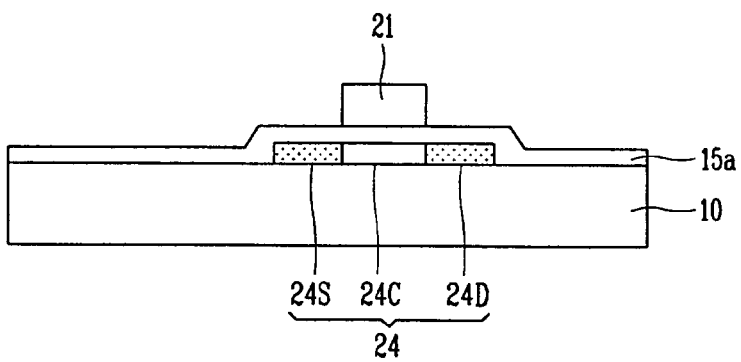
Figure 2D:
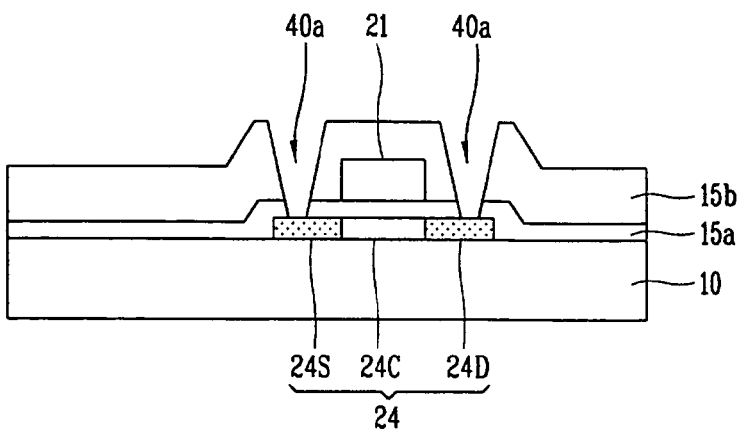
Figure 2E:
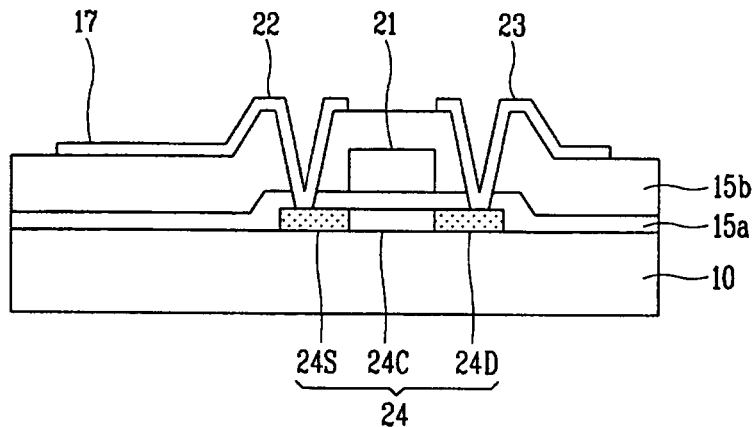
Figure 2F:
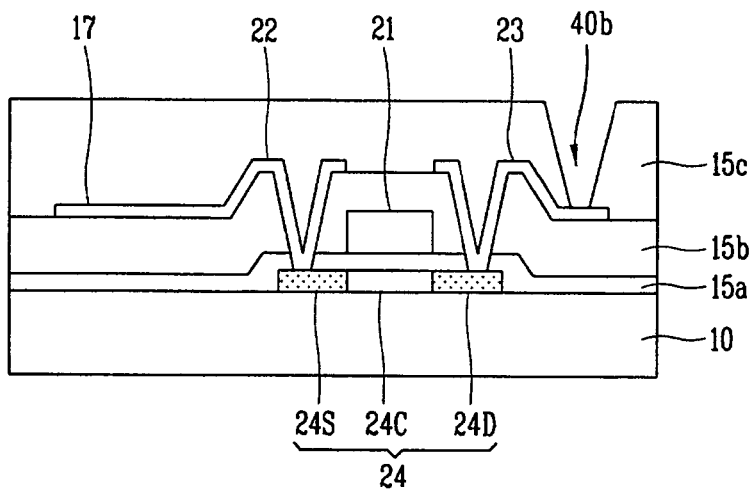
Figure 2G:
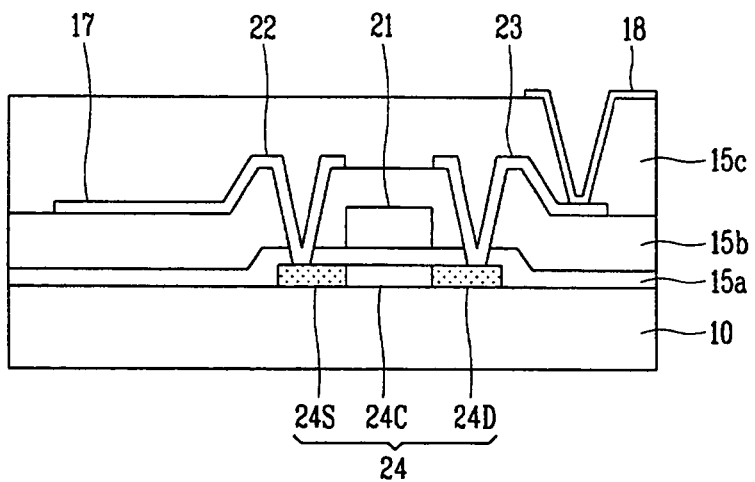
Figure 3:
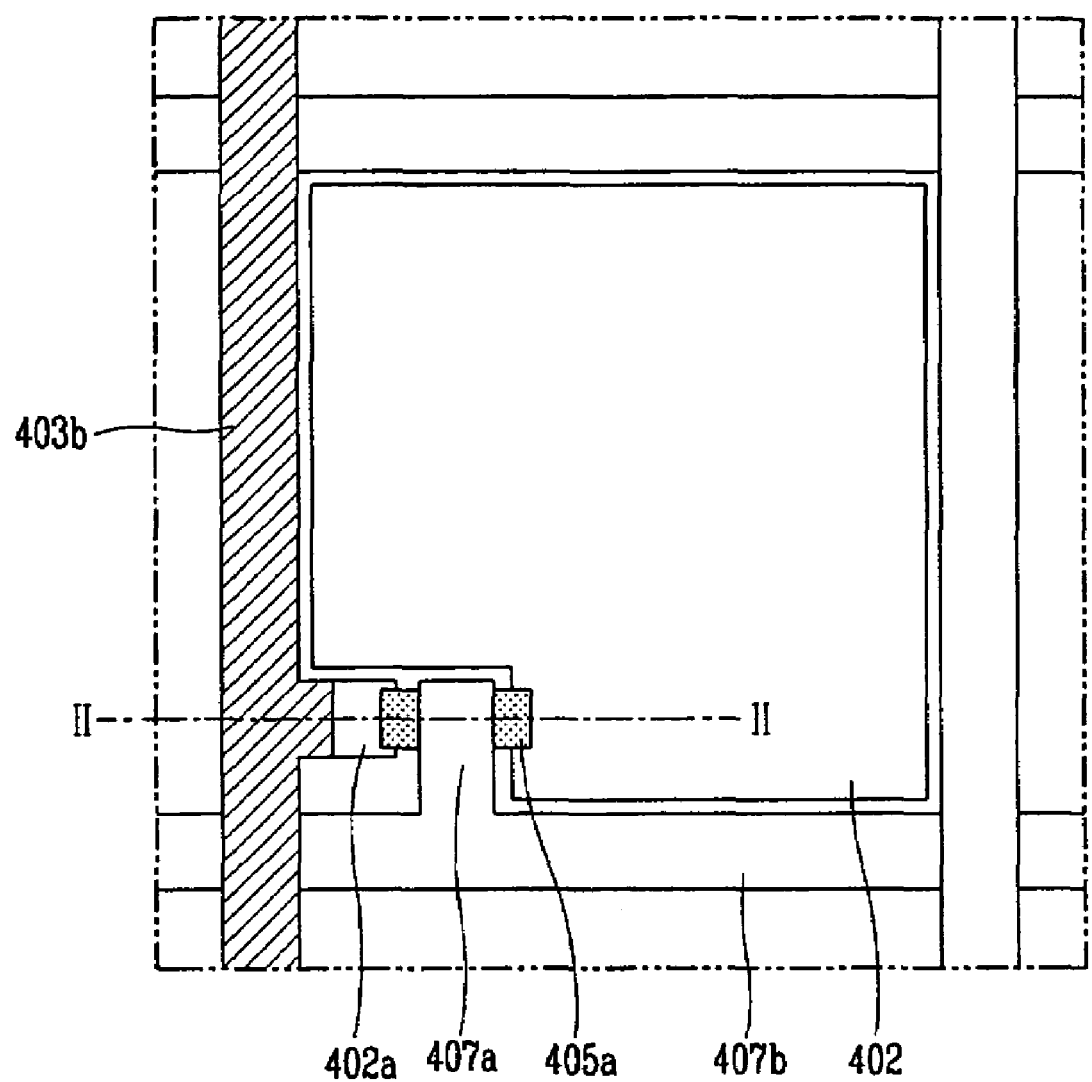
FIG. 3 is a plan view showing a part of an array substrate of a liquid crystal display device in accordance with an embodiment of the present invention.

Hereinafter, with reference to FIG. 3, a plan view showing a unit pixel of a liquid crystal display device formed in accordance with an embodiment of the present invention will be described, and a fabrication process of a thin film transistor as a switching device in a unit pixel will be described in reference to FIGS. 4 and 5. As shown in FIG. 3, a unit pixel of a liquid crystal display device is defined by a plurality of gate lines 407b and a plurality of data lines 403b perpendicularly crossing the gate lines 407b. An active layer 405a formed of a semiconductor layer is formed at one corner of the unit pixel. The active layer 405a is connected to the data line 403b via source electrode 402a made of the same material as the pixel electrode 402. The source electrode 402a between the data line extension 403a and the active layer 405a connects the data line 403b to the active layer 405a. The other side of the active layer 405a is overlapped by and connected to the pixel electrode 402. Also, the gate electrode 407a is formed over the active layer 405a with an insulating layer (not shown) interposed therebetween.

Figure 4A:
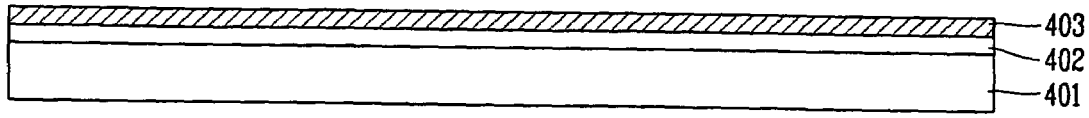
FIGS. 4A to 4G are cross-sectional views showing processes of fabricating a liquid crystal display device in accordance with an embodiment of the present invention.

FIGS. 4A to 4G are cross-sectional views showing a fabrication process along the line II-II of FIG. 3. As shown in FIG. 4A, a transparent electrode layer 402 for forming a pixel electrode is formed on a transparent substrate 401, and a conductive layer 403 for forming a data line is formed on the transparent electrode layer 402. The transparent electrode layer 402, such as ITO (Indium Tin Oxide) or IZO (Indium Zinc Oxide) can be a predetermined transparent electrode having a superior electrical contact characteristics with the conductive layer 403. The transparent electrode layer 402 is sputtered over the entire surface of the substrate 401, and subsequently, the conductive layer 403 is formed on the transparent electrode layer 402 by sputtering or the like.

The conductive layer 403 is for forming a data line. The conductive layer 403 includes metal materials, such as chrome(Cr), copper (Cu), aluminum (Al), molybdenum (Mo), gold (Au), platinum (Pt) or the like. In addition, a semiconductor layer which is doped with a dopant injected thereinto may be used as the conductive layer. After the conductive layer 403 is formed, a first photoresist is applied on the conductive layer 403 and an exposure process is performed using a first diffraction mask (not shown).

Figure 4B:
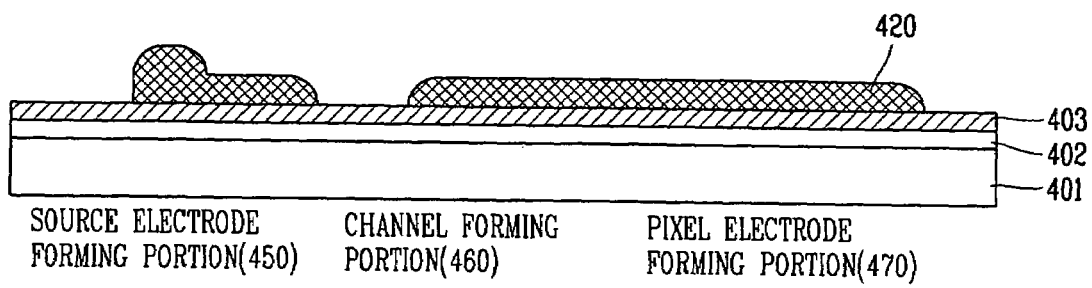

As a result of the exposure process, non-exposure and partial exposure are performed at a source electrode forming portion 450 for forming a source electrode, complete exposure is performed at a channel forming portion 460 for forming a channel, and partial exposure is performed at a pixel electrode forming portion 470 for forming a pixel electrode. In the region at which non-exposure is performed in the source electrode forming portion 450 coincides with a region at which a source electrode will be formed. As a result of the exposure, the conductive layer 403 of the channel forming portion 460 is exposed, as shown in FIG. 4B.

The present embodiment is described by taking a positive type photoresist as an example, and the positive type photoresist is removed in a development process after the photoresist is exposed. The photoresist could be a negative type or a positive type. Moreover, in the present embodiment, a diffraction mask including a pattern having a slit shape is used for diffraction exposure. However, a half-tone mask capable of controlling intensity of light to be exposed according to regions may alternatively be used.

Next, the conductive layer 403 is etched by using a diffraction-exposed first photoresist pattern 420 as a mask. As a result of the etching, the conductive layer 403 of the channel forming portion 460 and the transparent electrode layer 402 under the conductive layer 403 are removed so that the transparent electrode layer 402 is separated into a pixel electrode 402b and a source electrode 402a.

Figure 4C:
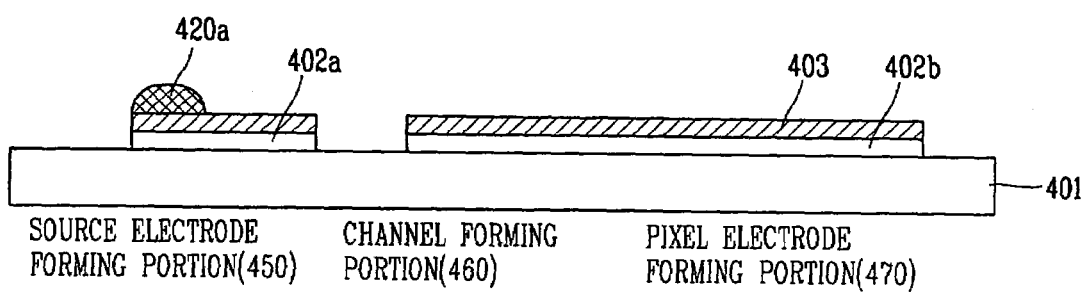

Next, as shown in FIG. 4C, the first photoresist pattern 420 is ashed and a predetermined photoresist pattern 420a remains only at the source electrode forming portion 450. As a result of the ashing, as shown in FIG. 4C, the photoresist pattern 420a is left on an upper portion of the source electrode forming portion 450 alone, and the conductive layer 403 is exposed at other regions. The conductive layer 403 is further etched using the photoresist pattern 420a remaining on the source electrode forming portion 450 so as to etch the pixel electrode 402b and the source electrode 402a, which are composed of the same materials.

Figure 4D:
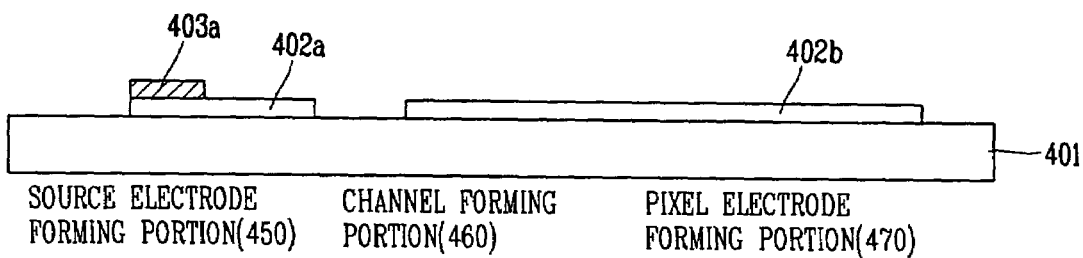

As shown in FIG. 4D, the data line extension 403a is formed by etching the conductive layer 403 so that the data line extension 403a is in contact with the source electrode 402a. The substrate 401 is also exposed in the channel forming portion 460 by such an etching. Further, the pixel electrode 402b is exposed in the pixel electrode forming portion 470.

Figure 4E:
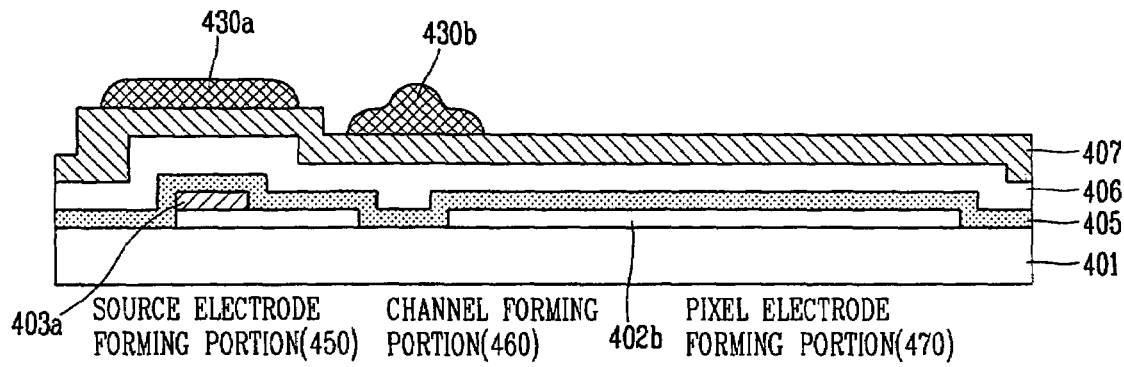

Subsequently, as shown in FIG. 4E, a semiconductor layer 405 may be formed over the substrate 401 by a plasma enhanced chemical vapor deposition (PECVD). The semiconductor layer 405 may be an amorphous silicon or a crystallized silicon layer. Because crystalline silicon is tens to one hundred times as fast as amorphous silicon in terms of electron mobility, the crystallized silicon is suitable for fabricating a switching device requiring rapid operation.

The methods of crystallization include heating an amorphous silicon layer in a furnace, using an excimer laser or by a rapid thermal annealing (RTA) method. Before crystallization, a dehydrogenation process in which hydrogen ions within the silicon layer being crystallized are removed. In the dehydrogenation process, the amorphous silicon layer to be crystallized is heated to about 400° C. to remove hydrogen. The dehydrogenation process is performed to prevent the hydrogen from exploding while performing a crystallization process.

After performing the crystallization of the semiconductor layer 405, as shown in FIG. 4E, an insulating layer 406 is formed on the semiconductor layer 405, and a second conductive layer 407 is formed on the insulating layer 406. The insulating layer 406 may be a monolayer of silicon oxide ($SiO_2$) or silicon nitride ($SiO_2$) or a dual layer of silicon nitride ($SiN_x$) and silicon oxide ($SiO_2$). The insulating layer 406 is interposed between the active layer and a gate electrode formed on the insulating layer 406. In addition, the second conductive layer 407 may be chrome, aluminum or molybdenum and have a predetermined thickness by a sputtering method.

After forming the second conductive layer 407, a second photoresist is applied on the second conductive layer 407, and an exposure process is performed using a second diffraction mask (not shown). As a result of development after the exposure, the photoresist is patterned to form certain patterns on upper portions of the source electrode forming portion 450 and the channel forming portion 460, respectively. Particularly, the photoresist pattern 430b formed on the upper portion of the channel forming portion 450 has a step shape because it has a partial exposure portion and a non-exposure portion. Meanwhile, a photoresist pattern 430a on the source electrode forming portion 450 is formed by diffraction exposure. The second conductive layer 407, the insulating layer 406 and the semiconductor layer 405 are etched by using the second photoresist patterns 430a and 430b formed by using a second slit mask so as to define the active layer 405a. The second conductive layer 407 may be effectively removed by wet etching, and the insulating layer 406 and the semiconductor layer 405 may be effectively removed by dry etching.

Figure 4F:
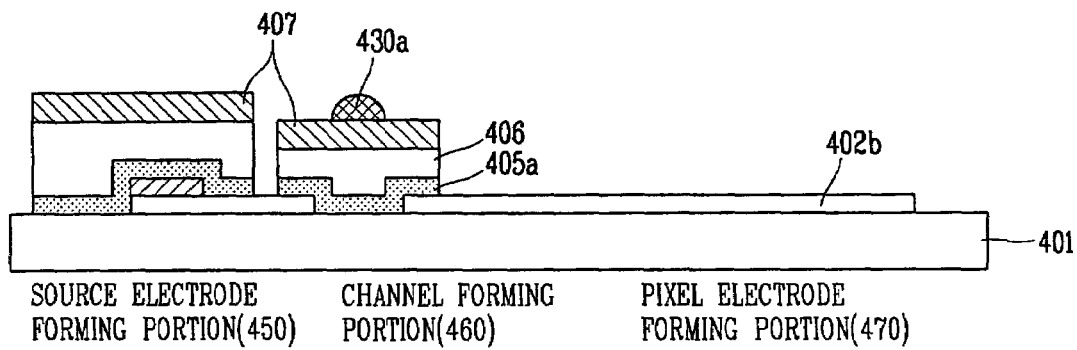

After defining the active layer 405a, the second photoresist patterns 430a and 430b are ashed, as shown in FIG. 4F, to form a predetermined photoresist pattern 430a on an upper portion of the channel forming portion 460. The second conductive layer 407 remaining on the upper portions of the channel forming portion 460 and the source electrode forming portion 450 is further etched using the photoresist pattern 430a remaining after the ashing so as to define the gate electrode 407a. Therefore, the active layer 405a and the gate electrode 407a may be formed by one mask, using the photoresist pattern formed by applying the second diffraction mask.

Figure 4G:
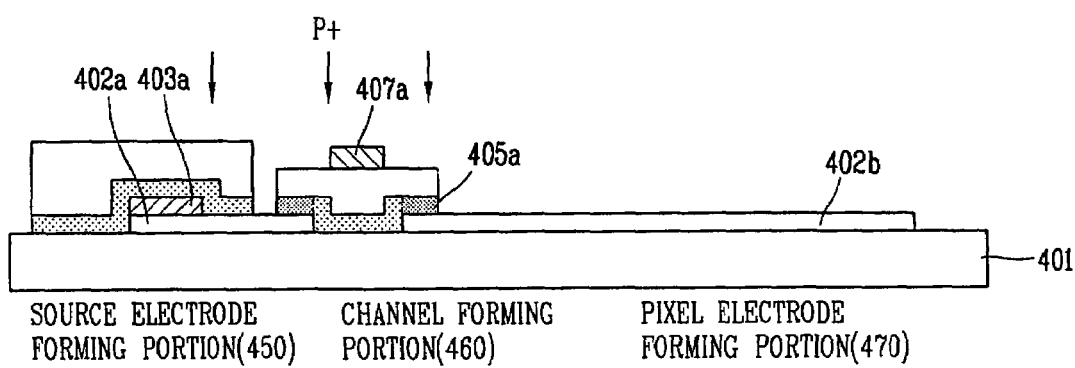

Next, as shown in FIG. 4G, impurity ions are injected into a predetermined regions of the active layer 405a using the gate electrode 407a as an ion blocking mask. The injection of the impurity ions improves ohmic contact characteristics of the source electrode 402a made up of a transparent electrode and the active layer 405a. However, if the source electrode 402a and the active layer 405a have superior ohmic contact characteristics with each other, the impurity ion-injection process may be unnecessary.

When the ohmic contact characteristics of the source electrode 402a and the active layer 405a are poor, a process of fabricating a thin film transistor having a structure in which the source electrode 402a and the active layer 405a do not directly contact with each other should be used, as shown in FIGS. 5A to 5F.

Figure 5A:
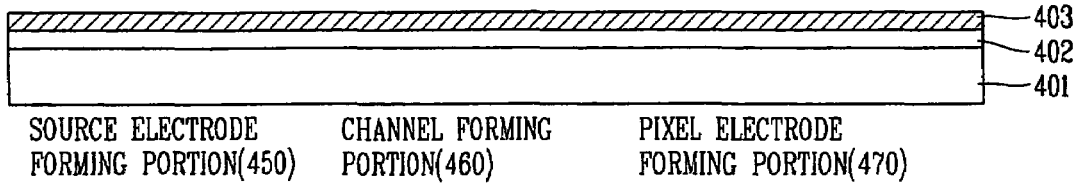
FIGS. 5A to 5F are cross-sectional views showing processes of fabricating a liquid crystal display device in accordance with an embodiment of the present invention.

As shown in FIG. 5A, by the same method as described in the embodiment of FIGS. 4A to 4F, a transparent electrode layer 402 is formed on a substrate 401, and a conductive layer 403 for forming a source electrode is formed on the transparent layer 402. The transparent electrode layer 402 is formed over the entire surface of the substrate 401 through a sputtering process, and subsequently, the first conductive layer 403 is formed on the transparent electrode layer 402. The first conductive layer 403 is for forming a data line. The first conductive layer 403 can be composed of metal materials, such as copper (Cu), aluminum (Al), molybdenum (Mo), gold (Au), platinum (Pt) and the like. In addition, a semiconductor layer which is doped by a injecting dopants thereinto can be used as the conductive layer.

After forming the first conductive layer 403, a first photoresist layer is applied to the first conductive layer, and an exposure process is performed by using a first diffraction mask (not shown). As a result of the exposure process, non-exposure is performed at a source electrode forming portion 450, complete exposure is performed at a channel forming portion 460 for forming a channel, and non-exposure and partial exposure are performed at a pixel electrode forming portion 470 for forming a pixel electrode. In this embodiment, a positive type photoresist like the first embodiment or a negative type photoresist may be used as a photoresist and a half-tone mask can be used as a diffraction mask.

Figure 5B:
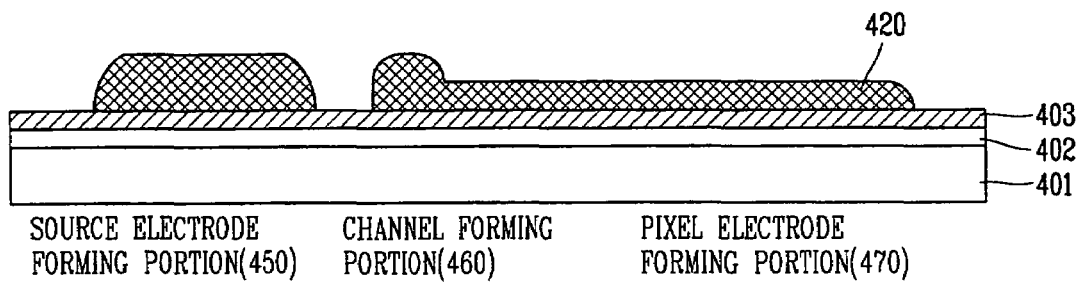

As a result of applying a first diffraction mask and performing exposure and development processes, as shown in FIG. 5B, the conductive layer 403 of the channel forming portion 460 is exposed. Subsequently, an etching process is performed using the first photoresist pattern 420 as a mask. As a result, the conductive layer 403 of the channel forming portion 460 and the transparent electrode layer 402 under the conductive layer are removed to separate the transparent electrode layer 402 into a pixel electrode 402b and a source electrode 402c.

Figure 5C:
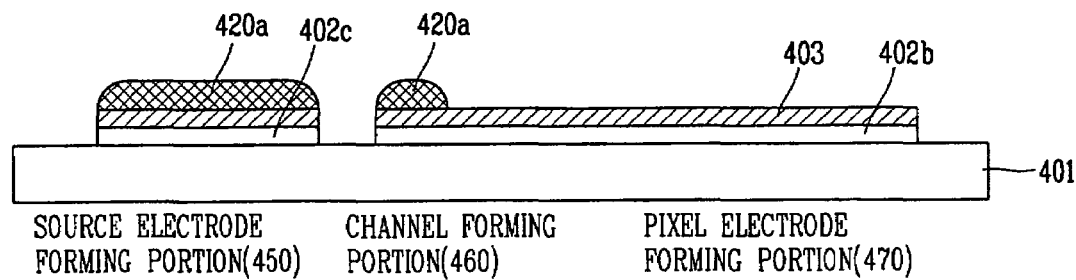

Subsequently, as shown in FIG. 5C, the first photoresist pattern 420 is ashed to leave a certain photoresist pattern on the source electrode forming portion 450 alone. The photoresist pattern is left on an upper portion of the source electrode forming portion 450 and a part of the pixel electrode forming portion 470, and the photoresist is removed at other regions to expose the conductive layer 403. The conductive layer 403 of the pixel electrode forming portion 470 is removed by using the photoresist pattern 420a remaining so that the pixel electrode 402b and source electrode are defined. After forming the pixel electrode 402b, the first photoresist pattern is removed. The subsequent processes are performed identically to the embodiment described in FIGS. 4C and 4D.

Figure 5D:
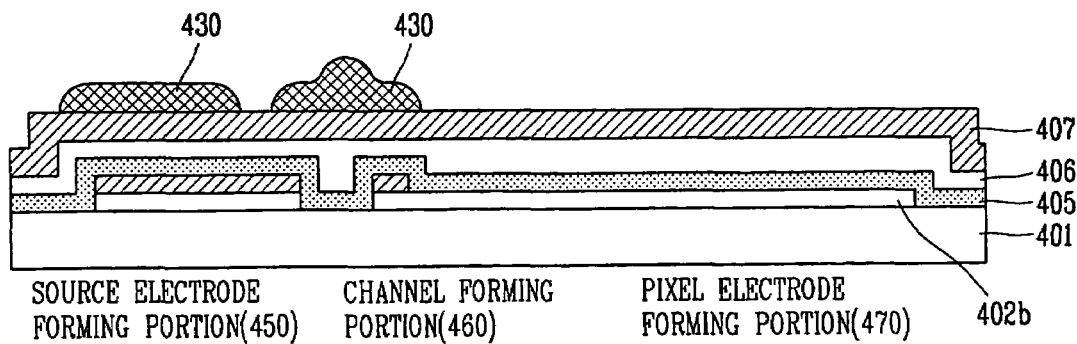

Next, as shown in FIG. 5D, a semiconductor layer 405 may be formed on the result by a plasma enhanced chemical vapor deposition (PECVD). The semiconductor layer 405 may be amorphous silicon or crystalline silicon layer. Because crystalline silicon is tens to one hundred times as fast as amorphous silicon in terms of electron mobility, the crystallized silicon is suitable for fabricating a switching device requiring rapid operation.

The methods of crystallization include heating an amorphous silicon layer in a furnace, using an excimer laser or by a rapid thermal annealing (RTA) method. Before crystallization, a dehydrogenation process in which hydrogen ions within the silicon layer being crystallized are removed. In the dehydrogenation process, the amorphous silicon layer to be crystallized is heated to about 400° C. to remove hydrogen. The dehydrogenation process is performed to prevent the hydrogen from exploding while performing a crystallization process.

After performing the crystallization of the semiconductor layer 405, as shown in FIG. 5D, an insulating layer 406 is formed on the semiconductor layer 405, and a second conductive layer 407 is formed on the insulating layer 406. The insulating layer 406 may be a monolayer of silicon oxide ($SiO_2$) or silicon nitride ($SiN_x$), or a dual layer of silicon oxide ($SiO_2$) and silicon nitride ($SiN_x$). The insulating layer 406 is an interlayer insulating layer and electrically separates the active layer from a gate electrode formed above the insulating layer 406. In addition, a second conductive layer 407 can be an aluminum metal layer or a molybdenum metal layer and have a predetermined thickness by a sputtering method. Thereafter, after forming the second conductive layer 407, a second photoresist is applied on the second conductive layer 407, and an exposure process is performed using a second slit mask (not shown).

As a result of development after the exposure process, the photoresist is patterned to form certain patterns on upper portions of the source electrode forming portion and the channel forming portion, respectively. The photoresist pattern formed on the upper portion of the channel forming portion has a stepped shape by a partial exposure portion and a non-exposure portion. The second conductive layer 407, the insulating layer 406 and the semiconductor layer 405 are etched by using the second photoresist pattern 430 formed by applying the second diffraction mask as a mask so as to define the active layer 405A. The second conductive layer 407 can be effectively removed by wet etching, and the insulating layer 406 and the semiconductor layer 405 can be effectively removed by dry etching.

Figure 5E:
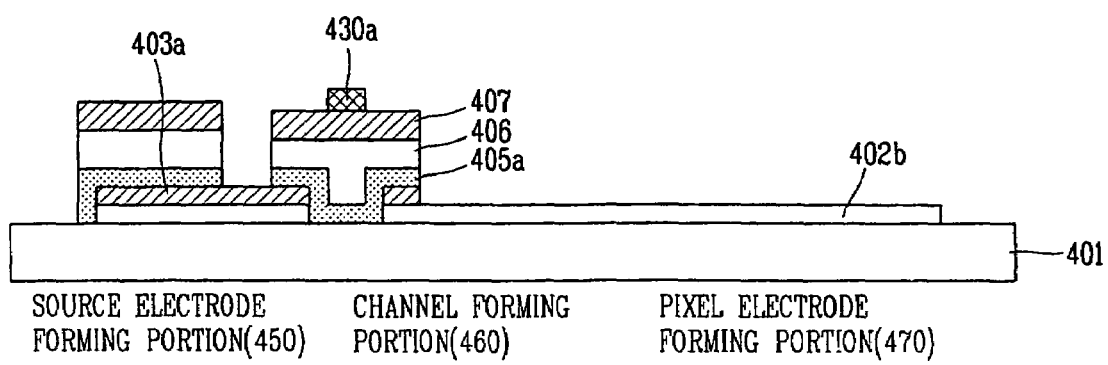

After defining the active layer 405A, the second photoresist pattern 430 are ashed, as shown in FIG. 5E, to form a predetermined photoresist pattern 430A on an upper portion of the channel forming portion. The second conductive layer 407 remaining on the upper portions of the channel forming portion 460 and the source electrode forming portion 450 is further etched using the photoresist pattern 430A remaining after the ashing so as to define the gate electrode 407A. Namely, the active layer 405a and the gate electrode 407a may be formed by one mask, using the photoresist pattern 430a formed by using a second diffraction mask.

Figure 5F:
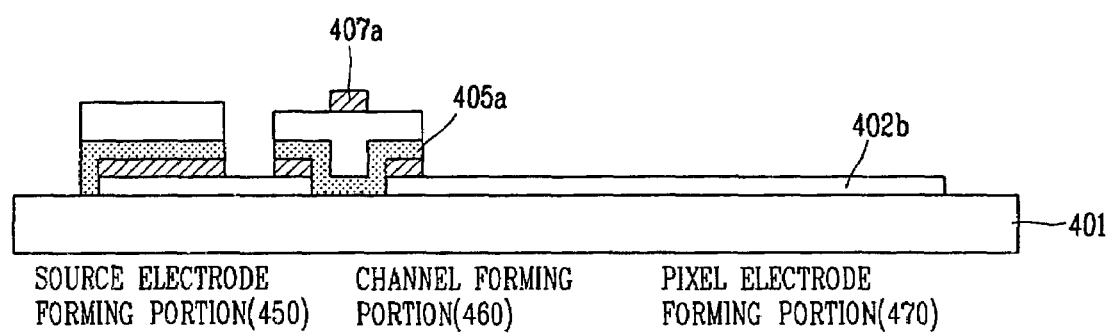

FIG. 5F is a cross-sectional view showing a structure of a thin film transistor formed using only two masks. After forming the gate electrode 407a, ohmic contact characteristics of the active layer and the conductive layer can be further enhanced by injecting impurity ions into side parts of the active layer 405a. Ohmic contact characteristics of the pixel active layer are enhanced as the active layer is not directly in contact with the pixel electrode but in contact with the pixel electrode by putting the conductive layer therebetween.

As so far described, in the present invention, a pixel electrode is formed on a substrate as a first layer, a pixel electrode and a source electrode are formed using a first mask, and an active layer and a gate electrode are formed using a second mask, so that a thin film transistor can be formed by two masks. Therefore, the number of processes can be significantly reduced in comparison to the conventional five-mask or four-mask processes to cut down on the fabrication costs. In addition, since defects which may occur during the processes can be minimized, liquid crystal display devices of good quality can be fabricated.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device comprising;
    a substrate;
    a pixel electrode and a source electrode extension portion formed on the substrate;
    a source electrode formed on the source electrode extension portion;

an active layer formed on the substrate and overlapping and connecting with the pixel electrode and the source electrode extension portion;

a gate insulating layer formed on the active layer; and a gate electrode formed over the gate insulating layer.

2. The liquid crystal display device of claim 1, wherein the source electrode extension portion is made of the same material as the pixel electrode.

3. The liquid crystal display device of claim 2, wherein a data line is formed on and overlapping the source electrode extension portion.

4. The liquid crystal display device of claim 1, wherein a first conductive layer is positioned between the source electrode and the active layer, and a second conductive layer is positioned between the pixel electrode and the active layer.

5. The method of claim 1, wherein the insulating layer is formed over the source electrode, and a gate line including the gate electrode is formed on the insulating layer.

6. The liquid crystal display device of claim 1, wherein portions of the active layer connected to the source electrode extension portion and the pixel electrode are doped with high density impurity ions.

* * * * *